United States Patent
Hayashi et al.

(10) Patent No.: US 10,090,832 B2
(45) Date of Patent: Oct. 2, 2018

(54) CONTROLLER FOR POWER CONVERTER HAVING A DELAYING UNIT

(71) Applicant: DENSO CORPORATION, Kariya, Aichi-pref. (JP)

(72) Inventors: Yoshinori Hayashi, Kariya (JP); Tomotaka Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/003,878

(22) Filed: Jan. 22, 2016

(65) Prior Publication Data

US 2016/0218621 A1    Jul. 28, 2016

(30) Foreign Application Priority Data

Jan. 22, 2015 (JP) ................. 2015-010330

(51) Int. Cl.
*H02M 1/08* (2006.01)
*H03K 17/16* (2006.01)
(Continued)

(52) U.S. Cl.
CPC ............ *H03K 17/168* (2013.01); *G01K 7/01* (2013.01); *H02M 1/088* (2013.01); *H02M 7/5387* (2013.01); *H03K 17/127* (2013.01); *G01K 2205/00* (2013.01); *H02M 7/48* (2013.01); *H02M 7/497* (2013.01); *H02M 7/501* (2013.01); *H02M 2001/0054* (2013.01); *H03K 17/164* (2013.01); *H03K 2017/0806* (2013.01); *H03K 2217/0036* (2013.01); *Y02B 70/1491* (2013.01)

(58) Field of Classification Search
CPC ........ H02M 7/48; H02M 7/497; H02M 7/501; H02M 2001/12
See application file for complete search history.

(56) References Cited

U.S. PATENT DOCUMENTS

2004/0222747 A1* 11/2004 Onozawa ............... G09G 3/296
                                                    315/169.1
2012/0194226 A1   8/2012 Itou et al.
(Continued)

FOREIGN PATENT DOCUMENTS

| JP | 2009-135626 A | 6/2009 |
| JP | 2009-159662 A | 7/2009 |
| JP | 2014-150696 A | 8/2014 |

*Primary Examiner* — Jue Zhang
*Assistant Examiner* — Lakaisha Jackson
(74) *Attorney, Agent, or Firm* — Oliff PLC

(57) ABSTRACT

In a controller for applying a first drive voltage signal to one of parallel-connected first and second switching elements to perform a predetermined switching operation of one of the first switching element and the second switching element according to change of a first drive voltage in one of the first and second switching elements, a voltage detector detects the first drive voltage of one of the first and second switching elements. A delaying unit delays an application of a second drive voltage signal to the other of the first switching element and the second switching element to perform the predetermined operation of the other of the first switching element and the second switching element according to change of a second drive voltage in the other thereof while the first drive voltage in one of the first and second switching elements is substantially a predetermined Miller voltage.

8 Claims, 5 Drawing Sheets

(51) Int. Cl.
*G01K 7/01* (2006.01)
*H02M 1/088* (2006.01)
*H02M 7/5387* (2007.01)
*H03K 17/12* (2006.01)
H02M 7/501 (2007.01)
H02M 7/48 (2007.01)
H02M 7/497 (2007.01)
H02M 1/00 (2006.01)
H03K 17/08 (2006.01)

(56) References Cited

U.S. PATENT DOCUMENTS

| | | | |
|---|---|---|---|
| 2012/0280728 A1 | 11/2012 | Hussein et al. | |
| 2013/0039100 A1* | 2/2013 | Kazama | H03K 17/164 |
| | | | 363/41 |
| 2013/0207712 A1* | 8/2013 | Suzuki | H03K 17/165 |
| | | | 327/379 |
| 2013/0322487 A1* | 12/2013 | Watanabe | G01K 7/02 |
| | | | 374/4 |
| 2014/0218099 A1 | 8/2014 | Yamada et al. | |

* cited by examiner

- 31 — DRIVE SIGNAL GENERATOR
- 32 — VOLTAGE DETECTOR
- 33 — CURRENT DETECTOR
- 34 — TEMPERATURE DETECTOR

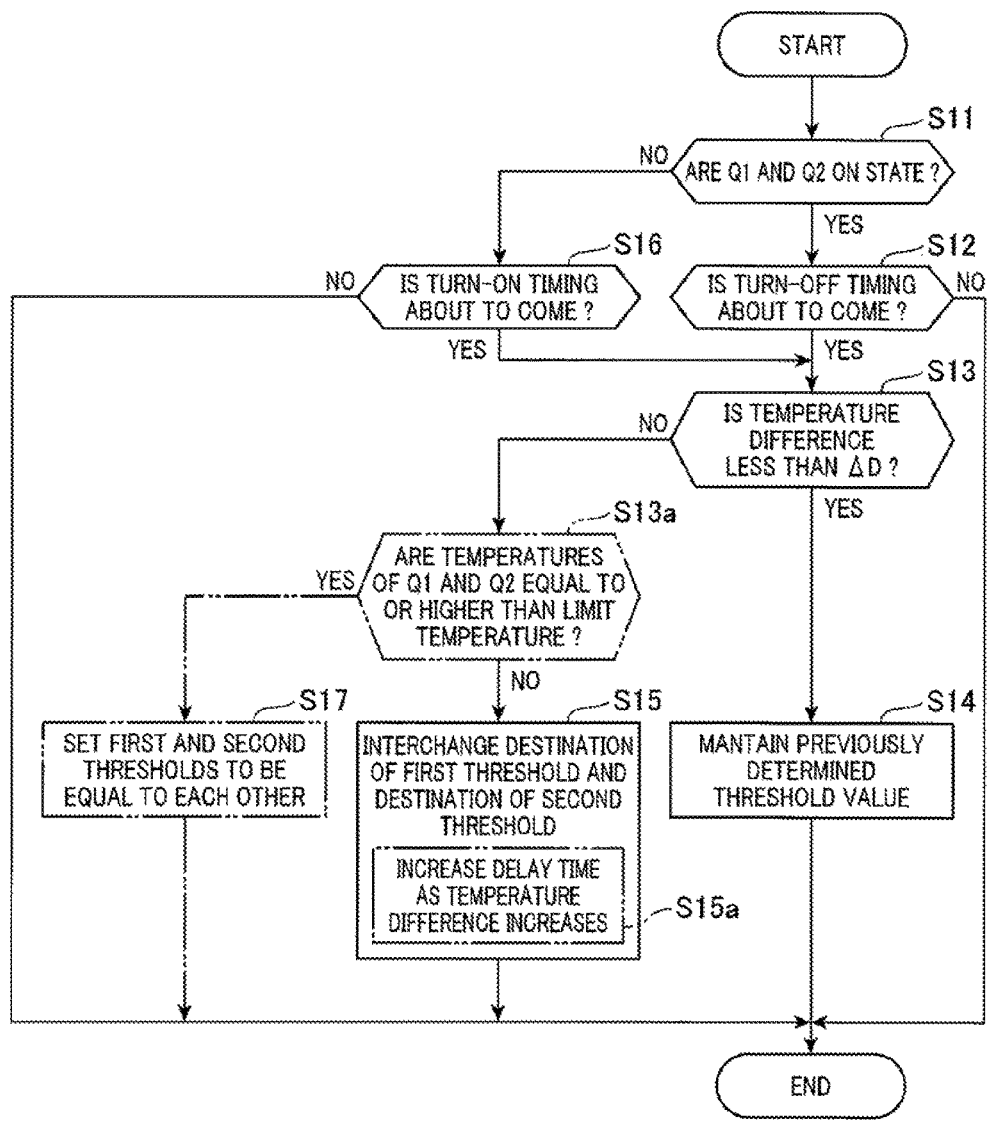

CONTROLLER FOR POWER CONVERTER HAVING A DELAYING UNIT

CROSS REFERENCE TO RELATED APPLICATIONS

This application is based on and claims the benefit of priority from Japanese Patent Application 2015-010330 filed on Jan. 22, 2015, the disclosure of which is incorporated in its entirety herein by reference.

TECHNICAL FIELD

The present disclosure relates to controllers for a power converter including a switch comprised of a first switching element and a second switching element connected in parallel to the first switching element.

BACKGROUND

Typical power converters for performing power conversion between a direct-current (DC) voltage and an alternating-current (AC) voltage include two series-connected switches for each phase of the AC voltage; each of the switches is comprised of a single switching element. These typical power converters alternately turn on and off the two series-connected switches, i.e. two switching elements, individually for each phase to perform power conversion accordingly. In particular, Japanese Patent Application Publication No. 2014-150696, which is referred to as patent document 1, discloses a power converter including two switches connected in series to each other for each phase of an AC voltage. Each of the two switches is comprised of two parallel-connected switching elements to increase a maximum value of an output current from the power converter.

SUMMARY

Turning on or off a switching element causes switching loss, such as turn-on loss or turn-off loss, to be generated. The power converter disclosed in the patent document 1 is able to increase the maximum value of the output current, but may increase the total switching loss in the power converter. This is because the switching loss in each switch, i.e. each of the two parallel-connected switching elements, for each phase of the power converter disclosed in the patent document 1 is greater than the switching loss in the corresponding switch, i.e. the corresponding switching element, for the corresponding phase of such a typical power converter.

In view of the circumstances set forth above, an exemplary aspect of the present disclosure seeks to provide controllers for a power converter comprised of a first switch and a second switch connected in series for at least one phase of the power converter; each of the first and second switches is comprised of a first switching element and a second switching element connected in parallel to each other. In particular, the exemplary aspect of the present disclosure seeks to provide such power converters, each of which is capable of reducing the total switching loss of the power converter.

According to an exemplary aspect of the present disclosure, there is provided a controller for applying a first drive voltage signal to one of parallel-connected first and second switching elements of a switch of a power converter. This performs a predetermined switching operation of one of the first switching element and the second switching element according to change of a first drive voltage in one of the first and second switching elements. The controller includes a voltage detector that detects the first drive voltage of one of the first and second switching elements. The controller also includes a delaying unit that delays an application of a second drive voltage signal to the other of the first switching element and the second switching element. This performs the predetermined switching operation of the other of the first switching element and the second switching element according to change of a second drive voltage in the other of the first and second switches while, the first drive voltage in one of the first and second switching elements is substantially a predetermined Miller voltage.

This configuration of the controller enables the predetermined switching operation of the other of the first and second switching elements to be performed white one of the first and second switching elements is in a conductive state at the Miller voltage. This reduces the level of switching loss generated from the switch comprised of the parallel-connected first and second switching elements. Accordingly, the power converter according to the exemplary aspect of the present disclosure reduces the total switching loss generated therefrom as compared with a power converter, which is configured such that switching loss is generated from each of the parallel-connected first and second switching elements of the switch.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more features of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIG. 7 is a flowchart schematically illustrating a switching control routine based on a second function, which is carried out by each drive IC every predetermined control cycle;

DETAILED DESCRIPTION OF EMBODIMENT

The following describes a power conversion system 100 according to an embodiment of the present disclosure with reference to the accompanying drawings.

Figure 1:
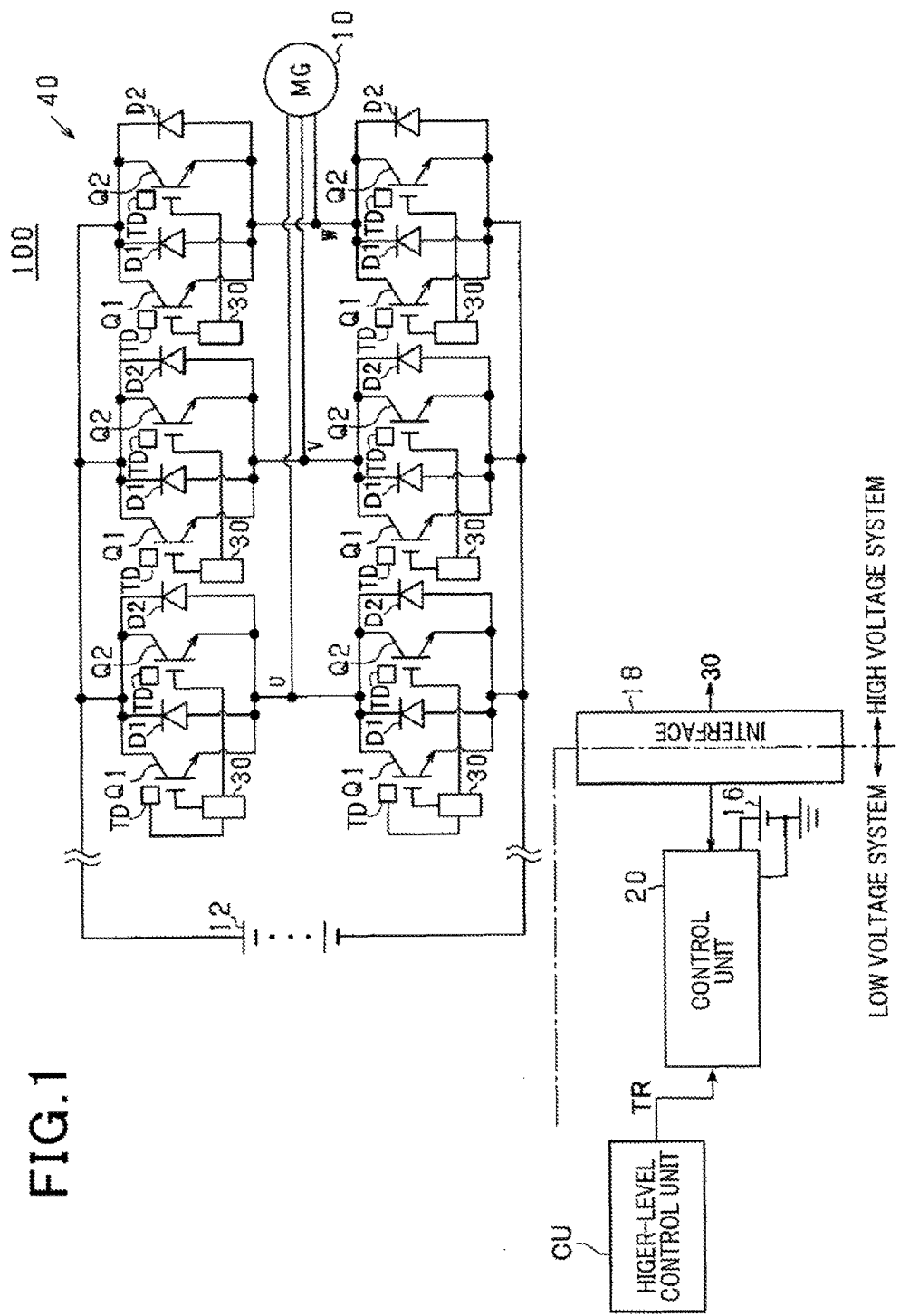
FIG. 1 is a circuit diagram schematically illustrating an overall configuration of a power conversion system according to an embodiment of the present disclosure.
Figure 2:
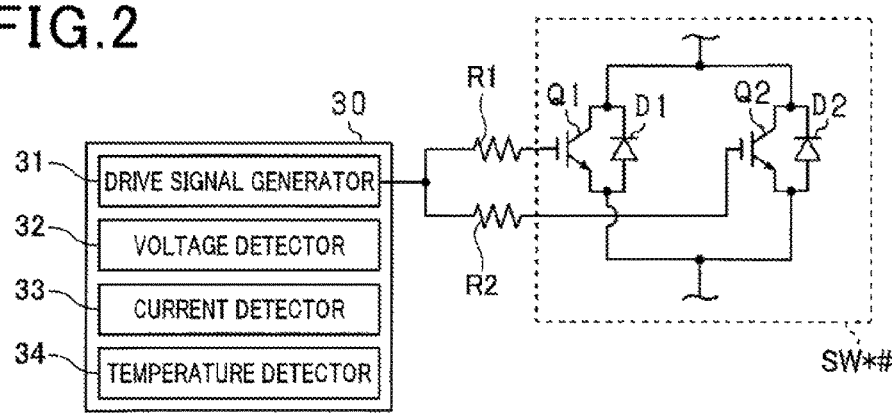
FIG. 2 is a block diagram schematically illustrating an example of the structure of a drive IC illustrated in FIG. 1.

Referring to FIGS. 1 and 2, the power conversion system 100 is installed in, for example, a vehicle. The power conversion system 100 includes, for example, a DC power source 12, a motor-generator (MG) 10, a low-voltage battery 16, an interface 18, a control unit, such as an electronic control unit (ECU), 20, drive integrated circuits (ICs) 30, and an inverter 40.

The DC power source 12 is a high-voltage battery having, for example, a terminal voltage equal to or higher than 100 V. The embodiment uses a rechargeable secondary battery, such as a lithium-ion battery cell or a nickel-hydride battery, or a capacitor as the DC power source 12.

The embodiment uses a three-phase synchronous or three-phase induction motor as the motor-generator 10, which is an example of rotary electric machines. The motor-generator 10 serves as both a motor and a generator; the motor serves as a driving source for running the vehicle. The motor-generator 10 includes three-phase windings, i.e. U, V, W-phase windings. The motor-generator 10 has a rotor 10r and an unillustrated output shaft coupled to the rotor 10r. An engine, which serves as a main engine for the vehicle, and/or driving wheels are coupled to the output shaft of the motor-generator 10 via an unillustrated power split mechanism.

The inverter 40 is electrically connected to the motor-generator 10, and to the DC power source 12 via, for example, a capacitor. The inverter 40, which serves as a motor, converts a DC voltage output from the DC power source 12 into an AC voltage, and applies the AC voltage, to the motor-generator 10. In addition, the motor-generator 10, which series as a generator, generates an AC voltage based on driving power received from the drive wheels, and converts the generated AC voltage into a DC voltage, thus charging the DC voltage into the DC power source 12.

The inverter 40 is designed as a three-phase inverter. The inverter 40 includes (1) A first pair of upper- and lower-arm switches SWup and SWun connected in series to each other for the U-phase winding (2) A second pair of upper- and lower-arm switches SWvp and SWvn connected in series to each other for the V-phase winding (3) A third pair of upper- and lower-arm switches SWwp and SWwp connected in series to each other for the W-phase winding.

The first to third pairs of the upper- and lower-arm switches are parallely connected to each other in bridge configuration.

Each of the switches SWup, SWun, SWvp, SWvn, SWwp, and SWwn is comprised of a switching element Q1 and a switching element Q2 connected in parallel to the switching element Q1. For example, the embodiment uses insulated-gate bipolar transistors (IGBTs) as the respective switching elements Q1 and Q2. Specifically, for each switch, the collector of the switching element Q1 is connected to the collector of the switching element Q2, and the emitter of the switching element Q1 is connected to the emitter of the switching element Q2.

The inverter 40 also includes a flywheel diode D1 electrically connected in antiparallel to the switching element Q1 of each of the switches SWup, SWun, SWvp, SWvn, SWwp, and SWwn. Similarly, the inverter 40 includes a flywheel diode D2 electrically connected in antiparallel to the switching element Q2 of each of the switches SWup, SWun, SWvp, SWvn, SWwp, and SWwn.

Power MOSFETs, bipolar transistors, and other switching elements can be used as the switching elements Q1, and Q2. When power MOSFETs are used as the switching elements Q1 and Q2, intrinsic diodes of the power MOSFETs can be used as the flywheel diodes, thus eliminating the need for external flywheel diodes.

The connection point between the upper- and lower-arm switches SWup and SWun, the connection point between the upper- and lower-arm switches SWvp and SWvn, and the connection point between the upper- and lower-arm switches SWwp and SWwn are connected to the U, V-, and W-phase windings of the motor-generator 10 in, for example the delta format or the star format.

The collectors of the switching elements Q1 and Q2 of each of the first, second, and third pairs are connected to the positive terminal of the DC power source 12. The emitters of the switching elements Q1 and Q2 of each of the first, second, and third pairs are connected to the negative terminal of the DC power source 12.

In addition, the inverter 40 includes temperature-sensitive diodes TD disposed to be close to the respective switching elements Q1 and Q2. The temperature-sensitive diode TD for each of the switching elements Q1 and Q2 measures the temperature of a corresponding one of the switching elements Q1 and Q2, and outputs, to the corresponding drive IC 30, a measurement signal indicative of the measured temperature of a corresponding one of the switching elements Q1 and Q2.

The drive ICs 30 are provided for the respective switches SWup, SWun, SWvp, SWvn, SWwp, and SWwn.

The control unit 20 includes, as its main component, a microcomputer, which is comprised of a CPU, a ROM, a RAM, and other known peripheral devices. The control unit 20 operates based on a power-supply voltage, which is lower than the terminal voltage across the DC power source 12, supplied from the low-voltage battery 16. Thus, the control unit 20 and the low-voltage battery 16 constitute a low voltage system. In contrast, the motor-generator 10, the inverter 40, and the DC power source 12 constitute a high voltage system.

The control unit 20 is communicably connected to, for example, a higher-level control unit CU, such as a higher-level ECU, than the control unit 20. The higher-level control unit CU inputs, to the control unit 20, requested torque, i.e.

commanded torque, TR that the motor-generator 10 is required to generate as an example of a controlled variable of the motor-generator 10.

The control unit 20 generates, according to the requested torque TR input from the higher-level control unit CU, pulsed command signals for driving the respective switching elements Q1 and Q2 of each switch of the inverter 40. For example, the pulsed command signals for the respective switching elements Q1 and Q2 of each switch of the inverter 40 are PWM signals each consisting of a train of pulses having a variable duty, i.e. a duty factor, for each predetermined switching period. The duty factor represents a controllable on-pulse width for each predetermined switching period. In other words, the duty factor represents a predetermined ratio, i.e. percentage, of an on duration to the total duration of each predetermined switching period.

That is, the duty factors of the command signals for the respective switching elements Q1 and Q2 of each switch of the inverter 40 are required to adjust the output torque of the motor-generator 10 to match with the request torque TR. The control unit 20 outputs the command signals generated for the respective switching elements Q1 and Q2 of the inverter 40 to the drive ICs 30.

Referring to FIG. 2, each of the switches SW*# (*=u, v, and w, and #=p and n) is comprised of the corresponding switching elements Q1 and Q2 as described above. Each of the switches SW*# is connected to the corresponding drive IC 30.

For example, the drive IC 30 is comprised of a control circuit and a low-voltage power source for operating the control circuit. That is, the drive IC 30 for each of the switches SW*# receives the command signals for the corresponding switching elements Q1 and Q2, and generates pulsed drive signals, i.e. drive voltage signals, whose duty cycles match with the duty cycles of the command signals. Then, the drive IC 30 applies the pulsed drive signals to the gates of the respective switching elements Q1 and Q2, thus selectively turning on and off individually each of the switching elements Q1 and Q2. In addition, the drive IC 30 monitors how the corresponding switching elements Q1 and Q2 are driven.

The interface 18 enables communications between each of the drive ICs 30 and the control unit 20. That is, the interface 18 enables communications between the high-voltage system equipped with the DC power source 12 and the low-voltage system equipped with the low-voltage battery 16 while electrically isolating from each other. This protects the control unit 20 from the terminal voltage, which is equal to or higher than 100 V, applied to the inverter 40 from the DC power source 12. For example, the interface 18 includes insulators, such as photocouplers, connecting between the respective drive ICs 30 and the control unit 20.

FIG. 2 schematically illustrates functional modules installed in each drive IC 30. Specifically, each drive IC 30 includes a drive signal generator 31, a voltage detector 32, a current detector 33, and a temperature detector 34, which are, for example, operatively linked to each other, as an example of the functional modules. Note that each of the modules 31 to 34 can be designed as a hardware module, a software module, or the combination of hardware and software modules.

Each drive IC 30 for the corresponding switch SW*# is connected to the gate of the corresponding switching element Q1 via a first resistor R1, and to the gate of the corresponding switching element Q2 via a second resistor R2. Each drive IC 30 for the corresponding switch SW*# is also connected to the temperature-sensitive diode TD for the switching element Q1, and to the temperature-sensitive diode TD for the switching element Q2. Note that FIG. 1 illustrates only the connection between the temperature-sensitive diode TD for the switching state Q1 of the switch SWup, and the connection between the temperature-sensitive diode TD for the switching state Q1 of the switch SWun, and eliminates the illustrations of the other connections for the sake of simply illustration of FIG. 1.

The drive signal generator 31 generates, based on the command signals for the corresponding switching elements Q1 and Q2, pulsed drive signals whose duty cycles match with the duty cycles of the command signals. Then, the drive signal generator 31 applies the generated drive signal for the switching element Q1 to the gate of the switching element Q1 via the first resistor R1. Similarly, the drive signal generator 31 applies the generated drive signal for the switching element Q2 to the gate of the switching element Q2 via the second resistor R2.

Specifically, the drive signal generator 31 applies the drive signal to each of the switching elements Q1 and Q2 to increase its gate voltage Vg to be higher than a predetermined threshold voltage when turning on the corresponding one of the switching elements Q1 and Q2. The drive signal generator 31 also applies the drive signal to each of the switching elements Q1 and Q2 to decrease its gate voltage Vg to be lower than the predetermined threshold voltage when turning off the corresponding one of the switching elements Q1 and Q2.

The voltage detector 32 measures a drive voltage for each of the switching elements Q1 and Q2; the drive voltage shows how each of the switching elements Q1 and Q2 is turned on or off. For example, the voltage detector 32 measures the gate voltage Vg of each of the switching elements Q1 and Q2 as an example of the drive voltage.

As another example, the voltage detector 32 measures an emitter-collector voltage Vce of each of the switching elements Q1 and Q2 as the drive voltage of the corresponding one of the switching elements Q1 and Q2.

As a further example, the voltage detector 32 can include a sense circuit, i.e. a sense resistor, connected to an unillustrated sense terminal of each of the switching elements Q1 and Q2. The sense terminal of each of the switching elements Q1 and Q2 outputs a minute current, referred to as a sense current, associated with a collector current Ice flowing through the emitter and collector of the corresponding one of the switching elements Q1 and Q2. Thus, the sense circuit measures a voltage across the sense resistor through which the sense current is flowing as a sense voltage Vs, thus detecting the sense voltage Vs as the drive voltage for each of the switching elements Q1 and Q2.

The current detector 33 measures the collector current Ice flowing through the emitter-collector of each of the switching elements Q1 and Q2. For example, the current detector 33 can measure the collector current Ice flowing through the emitter-collector of each of the switching elements Q1 and Q2 according to the sense current flowing through the sense terminal of the corresponding one of the f switching elements Q1 and Q2.

The temperature detector 34 receives the measurement signal output from each of the temperature-sensitive diodes TD provided, for the corresponding one of the switching elements Q1 and Q2. Then, the temperature detector 34 detects the temperature of each of the switching elements Q1 and Q2 according to the measurement signal of the corresponding one of the switching elements Q1 and Q2.

Switching, i.e. turning on or off, each of the switching elements Q1 and Q2 of each switch SW*# causes switching loss, such as turn-on loss or turn-off loss to be generated. That is, turning on or off simultaneously both the switching elements Q1 and Q2 of each switch SW*# may increase the switching loss of each switch SW*# to be greater than the switching loss of the corresponding switch comprised of a single switching element.

Figure 3:
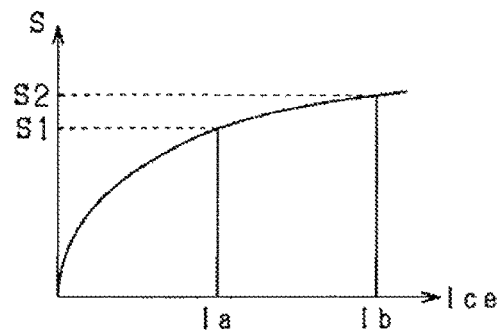
FIG. 3 is a graph schematically illustrating the relationship between a collector current flowing through each of switching elements and corresponding switching loss in turn-off of the corresponding one of the switching elements.
Figure 4:
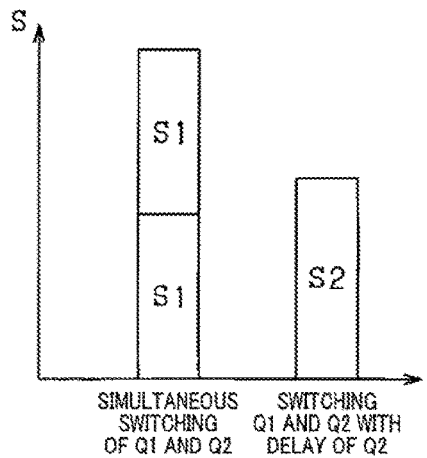
FIG. 4 is a graph schematically illustrating a level of the switching loss generated for simultaneous turn-off of the switching elements and a level of the switching loss generated in non-simultaneous turn-off of the switching elements.

The following describes in detail the switching loss generated in each switch SW*# comprised of the parallely connected switching elements Q1 and Q2. FIG. 3 schematically illustrates the relationship between the collector current Ice flowing through each of the switching elements Q1 and Q2 and the corresponding switching loss S in the turn-off of the corresponding one of the switching elements Q1 and Q2. FIG. 4 schematically illustrates a level S1 of the switching loss S generated for simultaneous, i.e. synchronous, turn-off of the switching elements Q1 and Q2 and a level S2 of the switching loss S generated in non-simultaneous, i.e. non-synchronous, turn-off of the switching elements Q1 and Q2.

Note that the switching loss, i.e. the turn-on or turn-off switching loss, generated from an IGBT is represented the product of the collector current Ice and the collector-emitter voltage Vce during the corresponding switching transition time between one of an on state and an off state to the other thereof, which is expressed as Ice×Vce.

FIG. 3 shows that simultaneous turn-off of the switching elements Q1 and Q2 while a value Ia of the collector current Ice is flowing through each of the switching elements Q1 and Q2 causes the level S1 of the switching loss 8, which is proportional to the value Ia of the collector current Ice, to be generated from the corresponding one of the switching elements Q1 and Q2. This results in the total switching loss S generated in the switch SW*# being 2×S1 (see FIG. 4).

In contrast, the embodiment of the present disclosure is configured to provide a delay time between the turn-off of one of the switching elements Q1 and Q2 and the turn-off of the other thereof for each of the switching period. For example, the embodiment is configured to, while the value Ia of the collector current Ice is flowing through each of the switching elements Q1 and Q2, turn off the switching element Q1 first, and thereafter turn off the switching element Q2 next.

This configuration reduces the level of the switching loss S generated from the switching element Q1 down to, for example, be nearly zero, because the switching element Q1 is turned off with the switching element Q2 being in the on state, i.e. with the collector-emitter voltage Vce being nearly equal to zero. In contrast, this configuration results in an increase of the value of the collector current Ice flowing through the switching element Q2 in the turn-off of the switching element Q2, because of the off state of the switching element Q1. Specifically, FIG. 4 illustrates that the value Ib of the collector current ice is flowing through the switching element Q2 after turn-off of the switching element Q1. The value Ib of the collector current Ice is two times larger than the value Ia of the collector current Ice, which is flowing through each of the switching elements Q1 and Q2 before turn-off of the switching element Q1.

Thus, turning off the switching element Q2 while the value Ib of the collector current Ice is flowing through the switching element Q2 causes the level S2 of the switching loss S to be generated from the switching element Q2; the level S2 of the switching loss S is proportional to the value Ib of the collector current Ice. Although the configuration generates the level S2 of the switching loss S, the configuration enables the level S2 of the switching loss S to be lower than level 2×S1 of the switching loss S generated at the simultaneous turn-off of both the switching elements Q1 and Q2.

The above, which has described turn-off of the switching elements Q1 and Q2, can be similarly applied to turn-on of the switching elements Q1 and Q2.

The configuration of the embodiment therefore reduces the switching loss S generated from the non-simultaneous switching operations of the switching elements Q1 and Q2 for each switch SW*# as compared with the switching loss S generated from simultaneous switching operations Q1 and Q2 for the corresponding switch SW*#.

In particular, the drive signal generator 30 of each switch SW*# according to the embodiment includes a delay circuit 50 for delaying turn-on and turn-off of one of the switching elements Q1 and Q2 relative to turn-on and turn-off of the other thereof.

Figure 5:
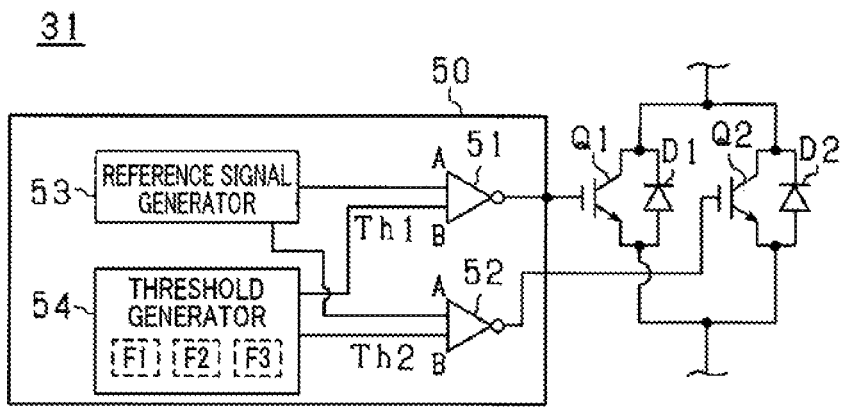
FIG. 5 is a block diagram schematically illustrating an example of the structure of a delay circuit, illustrated in FIG. 2, of each drive IC.

For example, as illustrated in FIG. 5, the delay circuit 50, which serves as, for example, a delaying unit, includes, for example, a first comparator 51, a second comparator 52, a reference signal generator 53, and a threshold generator 54. Note that each of the elements 50 to 54 can be designed as a hardware module, a software module, or the combination of hardware and software modules.

Each of the first and second comparators 51 and 52 has a first input terminal A and a second input terminal B, and an output terminal. The output terminal of the first comparator 51 is operatively connected to the gate of the switching element Q1 via the first resistor R1; the first resistor R1 is unillustrated in FIG. 5 for the sake of simplicity of FIG. 5. Similarly, the output terminal of the second comparator 52 is operatively connected to the gate of the switching element Q2 via the second resistor R2; the second resistor R2 is unillustrated in FIG. 5 for the sake of simplicity of FIG. 5.

The reference signal generator 53 is operatively linked to the input terminals A of the first and second comparators 51 and 52. The reference wave generator 53 generates a high-frequency triangular voltage signal TS as a reference voltage signal, and outputs the generated high-frequency triangular voltage signal TS to the input terminals A of the first and second comparators 51 and 52.

The threshold generator 54 is operatively linked to the input terminals B of the first and second comparators 51 and 52. The threshold generator 54 outputs a first threshold voltage Th1 as a first reference potential level to the input terminal B of the first comparator 51, and outputs a second threshold voltage Th2 as a second reference potential level to the input terminal B of the second comparator 52. The second threshold voltage Th2 differs from the first threshold voltage Th1. The embodiment sets the second threshold voltage Th2 to be lower than the first threshold voltage Th1, which is expressed as Th1>Th2.

Figure 6A:
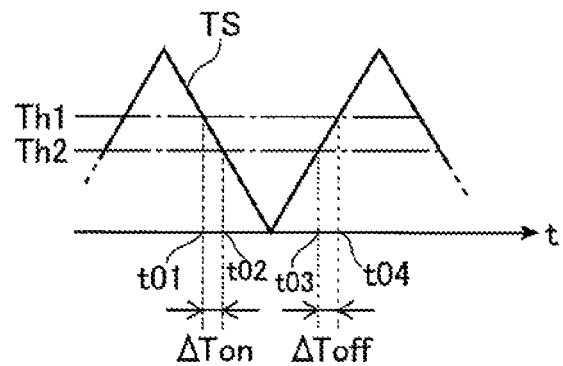
FIG. 6A is a graph schematically illustrating an example of the relationship between a high-frequency triangular voltage signal and each of first and second threshold voltages.
Figure 6B:
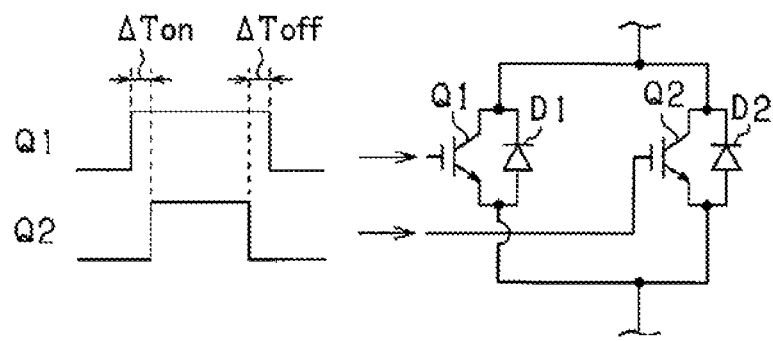
FIG. 6B is a circuit diagram schematically illustrating the waveform of an on state of each of the switching elements.

FIG. 6A illustrates an example of the relationship between the high-frequency triangular voltage signal TS and each of the first and second threshold voltages Th1 and Th2, and FIG. 6B illustrates the waveform of the on state of each of the switching elements Q1 and Q2.

Specifically, the first comparator 51 outputs the drive signal to turn on the switching element Q1 when the value of the high-frequency triangular voltage signal TS is equal to or lower than the first threshold voltage Vth1. The second comparator 52 outputs the drive signal to turn on the switching element Q2 when the value of the high-frequency triangular voltage signal TS is equal to or lower than the second threshold voltage Vth2. This enables a turn-on delay time ΔTon between the turn-on of the switching element Q1

(see time t01) and the turn-on of the switching element Q2 (see time t02) to be generated.

Additionally, the second comparator 52 outputs the drive signal to turn off the switching element Q2 when the value of the high-frequency triangular voltage signal TS is equal to or higher than the second threshold voltage Vth2. The first comparator 51 outputs the drive signal to turn off the switching element Q1 when the value of the high-frequency triangular voltage signal TS is equal to or higher than the first threshold voltage Vth1. This enables a turn-off delay time ΔToff between the turn-off of the switching element Q2 (see time t03) and the turn-off of the switching element Q1 (see time t04) to be generated.

Note that FIG. 6B shows an example where (1) The switching element Q1 is switched on first, and, after the lapse of the turn-on delay time ΔTon, the switching element Q2 is turned on (2) The switching element Q2 is switched of first, and, after the lapse of the turn-off delay time ΔToff, the switching element Q1 is turned off.

This enables the switching loss S generated from the switching element. Q2 in both turn-on and turn-off of the switching element Q2 to be reduced. In other words, this enables the switching loss S generated from each switch S*# to be limited to the switching loss Q1 generated from the switching element Q1 in both turn-on and turn-off of the switching element Q1. That is, the configuration of the drive ICs 30 results in reduction of the total switching loss generated from the inverter 40, i.e. the power conversion system 100, while increasing the maximum value of the output current from the inverter 40.

In particular, each drive IC according to the embodiment is configured to perform (1) A switching operation of one of the switching elements Q1 and Q2 first (2) A switching operation of the other of the switching elements Q1 and Q2 next within a Miller period of one of the switching elements Q1 and Q2.

The Miller period of a switching element represents a period during which the voltage at a control terminal of the switching element, such as the gate voltage Vg, which has risen or fallen to the Miller voltage in response to a drive signal, remains at the Miller voltage, and thereafter, the voltage at the control terminal rises or falls to its upper or lower limit. The Miller voltage of a switching element is set to be higher than the threshold voltage of the switching element.

Note that one of the switching elements Q1 and Q2, which is switched on or off earlier than the other thereof, will also be referred to as a former switching element, and the other of the switching elements Q1 and Q2 will also be referred to as a latter switching element.

That is, each drive IC 30 determines each of the first and second threshold voltages Th1 and Th2 such that the timing to start the delay period ΔTon or ΔToff of the latter switching element is within the Miller period of the former switching element. This determination enables switching loss generated from the pair of the switching elements Q1 and Q2 to be reduced while reducing the difference in timing between the switching operation of the switching element Q1 and that of the switching element Q2.

Note that one of the switching elements Q1 and Q2, such as the earlier turn-on switching element or the later turn-off switching element, from which switching loss is generated, may result in an increase of the temperature thereof due to the switching loss.

To address such an issue, each drive IC 30 according to the embodiment can include a first function F1 installed in, for example, the threshold generator 54. The first function F1 alternately selects the switching elements Q1 and Q2; the selected switching element is switched on or off earlier than the other of the switching elements Q1 and Q2.

For example, the first function F1 of each drive IC 30 alternately interchanges the destination of the first threshold voltage Th1 to the input terminal B of one of the first and second comparators 51 and 52 and the destination of the second threshold voltage Th2 to the input terminal B of the other of the first and second comparators 51 and 52.

In other words, the first function F1 of each drive IC 30 alternately selects one switching order, i.e. a turning-on order or turning-off order, of the switching elements Q1 and Q2 and the other switching order, i.e. the other turning-on order or turning-off order, of the switching elements Q1 and Q2.

In addition, each drive IC 30 according to the embodiment can include a second function F2 installed in, for example, the threshold generator 54. The second function F2 changes the switching order, i.e. the turning-on order or the turning-off order, of the switching elements Q1 and Q2 according to the results of comparison in temperature between the switching elements Q1 and Q2.

For example, the second function F2 of each drive IC 30 determines whether the absolute difference in temperature between the switching elements Q1 and Q2 is equal to or more than a predetermined temperature threshold ΔD each cycle to switch, i.e. turn on or off, the switching elements Q1 and Q2. The second function F2 of each drive IC 30 changes the switching order of the switching elements Q1 and Q2 in the previous cycle to the other switching order of the switching elements Q1 and Q2 in the present cycle upon determining that the absolute difference in temperature between the switching elements Q1 and Q2 is equal to or more than the temperature threshold ΔD in the present cycle.

For example, the second function F2 of each drive IC 30 interchanges, in the present cycle, the destination of the first threshold voltage Th1 to the input terminal B of one of the first and second comparators 51 and 52 and the destination of the second threshold voltage Th2 to the input terminal B of the other of the first and second comparators 51 and 52.

The first and second functions F1 and F2 of each drive IC 30 enable switching loss generated from the pair of the switching elements Q1 and Q2 to be reduced while reducing the absolute difference in temperature between the switching element Q1 and the switching element Q2.

Next, the following describes the switching control routine based on, for example, the second function F2, which is carried out by each drive IC 30 every predetermined control cycle, with reference to FIG. 7.

When performing a present switching control routine, each drive IC 30 determines whether the switching elements Q1 and Q2 are both in the on state according to, for example, the corresponding command signals sent from the control unit 20 in step S11. Upon determining that the switching elements Q1 and Q2 are both in the on state (YES in step S11), each drive IC 30 determines whether turn-off timing for the switching elements Q1 and Q2 is about to come or is coming according to the switching period in step S12.

Upon determining that neither turn-off timing for the switching elements Q1 and Q2 is about to come nor is coming according to the switching period (NO in step S12), each drive IC 30 terminates the switching control routine.

Otherwise, upon determining that turn-off timing for the switching elements Q1 and Q2 is about to come or is coming (YES in step S12), each drive IC 30 determines whether the absolute difference in temperature between the switching element Q1 and the switching element Q2 is less than the temperature threshold ΔD in step S13.

Upon determining that the absolute difference in temperature between the switching element Q1 and the switching element Q2 is less than the temperature threshold ΔD (YES in step S13), each drive IC 30 maintains the present threshold voltage set in the previous switching control routine in step S14.

For example, if the first threshold voltage Th1 was output to the input terminal B of the first comparator 51 and the second threshold voltage Th2 was output to the input terminal B of the second comparator 52 in the previous switching control routine, each drive IC 30 outputs the first threshold voltage Th1 to the input terminal B of the first comparator 51, and outputs the second threshold voltage Th2 to the input terminal B of the second comparator 52 in step S14.

The operation in step S14 of the example turns off the switching element Q2 according to the second threshold voltage Th2 earlier than the switching element Q1, and turns off the switching element Q1 according to the first threshold voltage Th1 during the Miller period of the switching element Q2.

Otherwise, upon determining that the absolute difference in temperature between the switching element Q1 and the switching element Q2 is equal to or more than the temperature threshold ΔD (NO in step S13), each drive IC 30 performs the operation in step S15.

Specifically, in step S15, each drive IC 30 interchanges (1) The destination, which was set in the previous switching control routine, of the first threshold voltage Th1 to the input terminal B of one of the first and second comparators 51 and 52

(2) The destination, which was set in the previous switching control routine, of the second threshold voltage Th2 to the input terminal B of the other of the first and second comparators 51 and 52.

For example, if the first threshold voltage Th1 was output to the input terminal B of the first comparator 51 and the second threshold voltage Th2 was output to the input terminal B of the second comparator 52 in the previous switching control routine, each drive IC 30 outputs the first threshold voltage Th1 to the input terminal B of the second comparator 52, and outputs the second threshold voltage Th2 to the input terminal B of the first comparator 51 in step S15.

The operation in step S15 of the example turns off the switching element Q1 according to the second threshold voltage Th2 earlier than the switching element Q2, and turns off the switching element Q2 according to the first threshold voltage Th1 during the Miller period of the switching element Q1.

On the other hand, upon determining that the switching elements Q1 and Q2 are not both in the on state (NO in step S11), each drive IC 30 determines whether turn-on timing for the switching elements Q1 and Q2 is about to come according to the switching period in step S16.

Upon determining that neither turn-on timing for the switching elements Q1 and Q2 is about to come nor is coming according to the switching period (NO in step S16), each drive IC 30 terminates the switching control routine.

Otherwise, upon determining that turn-on timing for the switching elements Q1 and Q2 is about to come according to the switching period (YES in step S16), each drive IC 30 determines whether the absolute difference in temperature between the switching element Q1 and the switching element Q2 is less than the temperature threshold ΔD in step S13.

Upon determining that the absolute difference in temperature between the switching element Q1 and the switching element Q2 is less than the temperature threshold ΔD (YES in step S13), each drive IC 30 maintains the present threshold voltage set in the previous switching control routine in step S14.

For example, if the first threshold voltage Th1 was output to the input terminal B of the first comparator 51 and the second threshold voltage Th2 was output to the input terminal B of the second comparator 52 in the previous switching control routine, each drive IC 30 outputs the first threshold voltage Th1 to the input terminal B of the first comparator 51, and outputs the second threshold voltage Th2 to the input terminal B of the second comparator 52 in step S14.

The operation in step S14 of the example turns on the switching element Q1 according to the first threshold voltage Th1 earlier than the switching element Q2, and turns on the switching element Q2 according to the second threshold voltage Th2 during the Miller period of the switching element Q1.

Otherwise, upon determining that the absolute difference in temperature between the switching element Q1 and the switching element Q2 is equal to or more than the temperature threshold ΔD (NO in step S13), each drive IC 30 performs the operation in step S15.

Specifically, in step S15, each drive IC 30 interchanges (1) The destination, which was set in the previous switching control routine, of the first threshold voltage Th1 to the input terminal B of one of the first and second comparators 51 and 52

(2) The destination, which was set in the previous switching control routine, of the second threshold voltage Th2 to the input terminal B of the other of the first and second comparators 51 and 52.

For example, if the first threshold voltage Th1 was output to the input terminal B of the first comparator 51 and the second threshold voltage Th2 was output to the input terminal B of the second comparator 52 in the previous switching control routine, each drive IC 30 outputs the first threshold voltage Th1 to the input terminal B of the second comparator 52, and outputs the second threshold voltage Th2 to the input terminal B of the first comparator 51 in step S15.

The operation in step S15 of the example turns on the switching element Q2 according to the first threshold voltage Th1 earlier than the switching element Q1, and turns on the switching element Q1 according to the second threshold voltage Th2 during the Miller period of the switching element Q2.

After completion of the operation in step S14 or S15, each drive IC 30 terminates the present switching control routine, and performs the switching control routine again when the control cycle has just elapsed since the termination of the present switching control routine.

Next, the following describes an example of how each drive IC 30 performs the switching control routine under the following conditions where (1) The absolute difference in temperature between the switching elements Q1 and Q2 is less than the temperature threshold ΔD (2) The destination of the first threshold voltage Th1 is set to the input terminal B of the first comparator 51, and the destination of the second threshold voltage Th2 is set to the input terminal B of the second comparator 52.

Figure 8A:
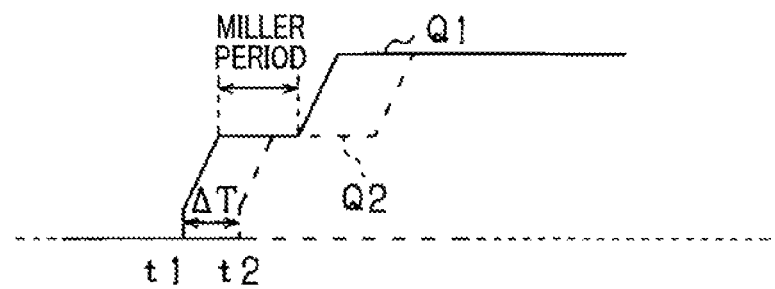
FIG. 8A is a timing chart schematically illustrating how the switching elements are turned on based on the switching control routine.

FIG. 8A shows that, when turn-on timing for the switching elements Q1 and Q2 is about to come while the switching elements Q1 and Q2 are in the off state (see YES in step S16), the switching element Q1 is turned on at time t1 earlier than the switching element Q2 (see step S14). Thereafter, the switching element Q2 is turned on at time t2 during the Miller period of the switching element Q1 (see step S14).

Note that, if the absolute difference in temperature between the switching elements Q1 and Q2 is equal to or more than the temperature threshold ΔD (NO in step S13), the switching element Q2 is turned on at the time t1 earlier than the switching element Q1 (see step S15). Thereafter, the switching element Q1 is turned on at the time t2 during the Miller period of the switching element Q2 (see step S15).

Figure 8B:
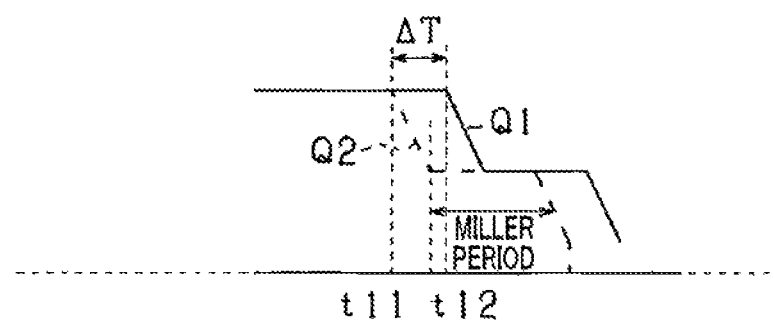
FIG. 8B is a timing chart schematically illustrating how the switching elements are turned off based on the switching control routine.

FIG. 8B shows that, just before the switching elements Q1 and Q2 are about to turn off while the switching elements Q1 and Q2 are in the on state (see YES in step S14), the switching element Q2 is turned off at time t11 earlier than the switching element Q1 (see step S14). Thereafter, the switching element Q1 is turned off at time t12 during the Miller period of the switching element Q2 (see step S14).

Note that, if the absolute difference in temperature between the switching elements Q1 and Q2 is equal to or more than the temperature threshold ΔD (NO in step S13), the switching element Q1 is turned off at the time t11 earlier than the switching element Q2 (see step S15). Thereafter, the switching element Q2 is turned off at the time t12 during the Miller period of the switching element Q1 (see step S15).

Each drive IC 30 described above is configured to (1) Perform a switching operation of one of the switching elements Q1 and Q2

(2) Perform a switching operation of the other of the switching elements Q1 and Q2 during the Miller period of one of the switching elements Q1 and Q2.

In other words, each drive IC 30 is configured to turn on or off one of the switching elements Q1 and Q2, and delay turn-off or turn-on of the other of the switching elements Q1 and Q2 so as to perform turn-off or turn-on of the other thereof during the Miller period of one of the switching elements Q1 and Q2.

This configuration enables the other of the switching elements Q1 and Q2 to be switched on or off while one of the switching elements Q1 and Q2 is in a conductive state at the Miller voltage higher than the threshold voltage. This reduces the level of switching loss generated from each switch SW*# comprised of the parallel-connected switching elements Q1 and Q2. Accordingly, the inverter 40 according to the embodiment reduces the total switching loss generated therefrom as compared with an inverter, which is configured such that switching loss is generated from each of the parallel-connected switching elements.

Let us consider that each drive IC 30 performs a switching operation of one of the switching elements Q1 and Q2, and, after lapse of a predetermined time, performs a switching operation of the other of the switching elements Q1 and Q2 while switching of one of the switching elements Q1 and Q2 is being carried out. In this case, variations in, for example, the switching elements Q1 and Q2 and/or other factors may cause the other of the switching elements Q1 and Q2, i.e. the latter switching element, to be switched earlier than one of the switching elements Q1 and Q2, i.e. the former switching element. This may cause a current from each drive IC 30 for performing, for example, the switching operations of both the switching elements Q1 and Q2, to concentrically flow through the latter switching element. The variations in, for example, the switching elements Q1 and Q2 and/or other factors may also cause the latter switching element to be switched after the switching of the former switching element has been completed. This may cause a current from each drive IC 30 for performing, for example, the switching operations of both the switching elements Q1 and Q2, to concentrically flow through only each of the former and latter switching elements.

In contrast, each drive IC 30 according to the embodiment is configured to perform a switching operation of the latter switching element during the Miller period of the former switching element. This configuration enables each drive IC 30 to easily understand how the switching process of the former switching element is carried out according to the drive voltage for the former switching element. This therefore makes it possible to reliably perform a switching operation of the latter switching element during the Miller period of the former switching element, thus preventing a current for performing the switching operations of both the switching elements Q1 and Q2 from concentrically flowing through the former switching element or the latter switching element.

The configuration of each drive IC 30 according to the embodiment may result in an increase of the temperature of the earlier turn-on switching element or later turn-off switching element, from which switching loss is generated. This may result in the difference in temperature between the switching elements Q1 and Q2.

To address such an issue, each drive IC 30, which cyclically turns on or off the switching elements Q1 and Q2, is capable of alternately selecting the switching elements Q1 and Q2; the selected switching element is to be switched on or off earlier than the other of the switching elements Q1 and Q2. That is, each drive IC 30 selects the first switching element Q1, which is to be switched on or off earlier than the switching element Q2 at a given cycle, and selects the second switching element Q2, which is to be switched on or off earlier than the switching element Q1 at the next cycle.

This configuration of each drive IC 30 enables switching loss generated from the pair of the switching elements Q1 and Q2 to be reduced while reducing the absolute difference in temperature between the switching element Q1 and the switching element Q2.

In particular, each drive IC 30, which cyclically turns on or off the switching elements Q1 and Q2, determine whether the difference in temperature between the switching elements Q1 and Q2 is equal to or more than the temperature threshold ΔD. Then, each drive IC 30 selects one of the switching elements Q1 and Q2 as a former switching element that is to be switched on or off earlier than the other of the switching elements Q1 and Q2 upon determining that the difference in temperature between the switching elements Q1 and Q2 is equal to or more than the temperature threshold ΔD. This selection enables the temperature of one of the switching elements Q1 and Q2, which is higher in temperature than the other thereof, to fall.

This results in reduction of the difference in temperature between the first and second switching elements Q1 and Q2.

Next, the following describes typical modifications of the embodiment of the present disclosure. In the descriptions of the typical modifications, redundant descriptions of like parts between the embodiment and each modification, to which like referenced characters are assigned, are omitted or simplified. The following typical modifications are some of all considerable modifications of the embodiment, and therefore, the following typical modifications cannot limit the scope of the present disclosure. Some of the features of the embodiment and all or some of the features of the following typical modifications can be cooperatively combined with each other within the scope of the present disclosure unless there are technical contradictions in the combinations Each drive IC 30 according to the embodiment delays turn-on of the latter switching element selected from the switching elements Q1 and Q2 by the delay time ΔTon, and delays turn-off of the latter switching element selected from the switching elements Q1 and Q2 by the delay time ΔToff, but the present disclosure is not limited thereto.

Specifically, each drive IC 30 according to a first modification is configured to delay turn-on or turn-off of the latter switching element selected from the switching elements Q1 and Q2 by the corresponding delay time ΔTon or ΔToff.

First, the following describes how each drive IC 30 according to the first modification delays turn-on of the latter switching element selected from the switching elements Q1 and Q2 by the corresponding delay time ΔTon.

Figure 9A:
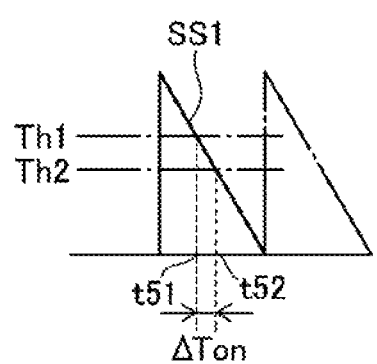
FIG. 9A is a graph schematically illustrating an example of the relationship between a first high-frequency saw-tooth voltage signal and each of first and second threshold voltages according to a first modification of the embodiment.

Specifically, the reference signal generator 53 can generate a first high-frequency saw-tooth voltage signal SS1 (see FIG. 9A) as a reference signal, and output the generated first high-frequency saw-tooth voltage signal SS1 to the input terminals A of the first and second comparators 51 and 52.

The first comparator 51 according to the first modification outputs the drive signal to turn on the switching element Q1 when the value of the first high-frequency saw-tooth voltage signal SS1 is equal to or lower than the first threshold voltage Vth1. The second comparator 52 outputs the drive signal to turn on the switching element Q2 when the value of the first high-frequency saw-tooth voltage signal SS1 is equal to or lower than the second threshold voltage Vth2. This enables a turn-on delay time ΔTon between the turn-on of the switching element Q1 (see time t51) and the turn-on of the switching element Q2 (see time t52) to be generated.

Next, the following describes how each drive IC 30 according to the first modification delays turn-off of the latter switching element selected from the switching elements Q1 and Q2 by the corresponding delay time ΔToff.

Figure 9B:
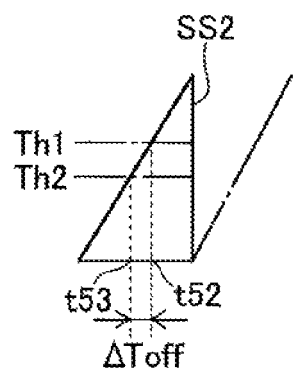
FIG. 9B is a graph schematically illustrating an example of the relationship between a second high-frequency saw-tooth voltage signal and each of first and second threshold voltages according to the first modification of the embodiment.

Specifically, the reference signal generator 53 can generate a second high-frequency saw-tooth voltage signal SS2 (see FIG. 9B) as a reference signal, and output the generated second high-frequency saw-tooth voltage signal 852 to the input terminals A of the first and second comparators 51 and 52.

The first comparator 51 according to the first modification outputs the drive signal to turn on the switching element Q1 when the value of the second high-frequency saw-tooth voltage signal SS2 is equal to or higher than the first threshold voltage Vth1. The second comparator 52 outputs the drive signal to turn on the switching element Q2 when the value of the second high-frequency saw-tooth voltage signal SS2 is equal to or higher than the second threshold voltage Vth2. This enables a turn-off delay time ΔToff between the turn-off of the switching element Q2 (see time t53) and the turn-off of the switching element Q1 (see time t54) to be generated.

Each drive IC 30 according to a second modification of the embodiment changes the delay time ΔTon and the delay time ΔToff depending on the absolute difference in temperature between the switching elements Q1 and Q2.

For example, each drive IC 30 according to the second modification changes at least one of the first threshold voltage Th1 and the second threshold voltage Th2 to increase at least one of the delay time ΔTon and the delay time ΔToff as the absolute difference in temperature between the switching elements Q1 and Q2 increases in step S15a. This enables switching loss generated from the pair of the switching elements Q1 and Q2 to be reduced while more reducing the absolute difference in temperature between the switching element Q1 and the switching element Q2.

Each drive IC 30 according to the embodiment performs the switching control routine based on the second function F2, but the present disclosure is not limited thereto. Specifically, as described above, each drive IC 30 can perform a switching control routine based on the first function F1 to alternately select the switching elements Q1 and Q2; the selected switching element is to be switched on or off earlier than the other of the switching elements Q1 and Q2. In addition, each drive IC 30 can include a third function F3 that interchanges a predetermined switching order, i.e. a turning-on order or turning-off order, of the switching elements Q1 and Q2 and the other switching order, i.e. the other turning-on order or the turning-off order, of the switching elements Q1 and Q2 each time a predetermined number of switching operations, i.e. turn-on and/or turn-off operations, are carried out.

Each drive IC 30 according to the embodiment can be configured to perform time-gap switching of the switching elements Q1 and Q2. The time-gap switching of the switching elements Q1 and Q2 means (1) Turning on or turning off one of the switching elements Q1 and Q2 first (2) Turning on or turning off the other of the switching elements Q1 and Q2 next with a predetermined time gap between the turning on or turning off of one of the switching elements Q1 and Q2 and the turning on or turning off of the other thereof.

None of the drive ICs 30 according to the present disclosure can perform the time-gap switching of the switching elements Q1 and Q2 upon determining that the temperatures of both the switching elements Q1 and Q2 are higher than a predetermined limit temperature for the time-gap switching.

Specifically, after the negative determination in step S13, each drive IC 30 can determine whether the temperatures of both the switching elements Q1 and Q2 are equal to or higher than the predetermined limit temperature for the time-gap switching in step S13a.

Upon determining that the temperatures of both the switching elements Q1 and Q2 are less than the predetermined limit temperature for the time-gap switching (NO in step S13a), each drive IC 30 performs the operation in step S15 set forth above.

Otherwise, upon determining that the temperatures of both the switching elements Q1 and Q2 are equal to or higher than the predetermined limit temperature for the time-gap switching (YES in step S13a), each drive IC 30 sets the first and second threshold voltages Th1 and Th2 to be identical to each other in step S17. This disables the generation of the delay times ΔTon and ΔToff.

A drive IC 30, which serves as a controller according to the present disclosure, can be applied to various power converters, at least one of which is installed in vehicles, such as hybrid vehicles or electric vehicles, each of which is equipped with a rotary electric machine as its main engine.

While the illustrative embodiment of the present disclosure has been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A controller for applying a first drive voltage signal to one of parallel-connected first and second switching elements of a switch of a power converter to perform a predetermined switching operation of one of the first switching element and the second switching element according to change of a first drive voltage in one of the first and second switching elements, the controller comprising:
a voltage detector that detects the first drive voltage of one of the first and second switching elements;
a delaying unit that delays an application of a second drive voltage signal to the other of the first switching element and the second switching element; and
a drive performing unit configured to perform, based on a change of the delayed second drive voltage signal, the predetermined switching operation of the other of the first switching element and the second switching element while the first drive voltage in one of the first and second switching elements is substantially maintained at a Miller voltage during a predetermined Miller period.

2. The controller according to claim 1, wherein the delaying unit is configured to:
apply the first drive voltage signal to one of the first and second switching elements to perform the predetermined switching operation of one of the first switching element and the second switching element, one of the first and second switching elements being referred to as a former switching element, the other of the first and second switching elements being referred to as a latter switching element; and
alternately select the first switching element and the second switching element as the former switching element.

3. The controller according to claim 2, further comprising a temperature detector that detects a difference in temperature between the first switching element and the second switching element,
wherein the delaying unit is configured to variably set, according to the detected difference in temperature between the first switching element and the second switching element, a delay time between a first timing of an application of the first drive voltage signal and a second timing of the application of the second drive voltage.

4. The controller according to claim 3, wherein the delaying unit is configured to:
determine whether the detected difference in temperature between the first switching element and the second switching element is equal to or higher than a predetermined temperature threshold, one of the first and second switching elements lower in temperature than the other thereof being referred to as a lower-temperature switching element, the other of the first and second switching elements being referred to as a higher-temperature switching element; and
select, when the delaying unit determines that the detected difference in temperature between the first switching element and the second switching element is equal to or higher than the predetermined temperature threshold, one of the first switching element and the second switching element as the former switching element so as to increase a temperature of the lower-temperature switching element.

5. The controller according to claim 1, further comprising a temperature detector that detects a difference in temperature between the first switching element and the second switching element,
wherein the delaying unit is configured to variably set, according to the detected difference in temperature between the first switching element and the second switching element, a delay time between a first timing of an application of the first drive voltage signal and a second timing of the application of the second drive voltage.

6. The controller according to claim 5, wherein the delaying unit is configured to:
determine whether the detected difference in temperature between the first switching element and the second switching element is equal to or higher than a predetermined temperature threshold, one of the first and second switching elements lower in temperature than the other thereof being referred to as a lower-temperature switching element, the other of the first and second switching elements being referred to as a higher-temperature switching element; and
apply, when the delaying unit determines that the detected difference in temperature between the first switching element and the second switching element is equal to or higher than the predetermined temperature threshold, the first drive voltage to one of the first switching element and the second switching element so as to increase a temperature of the lower-temperature switching element.

7. The controller according to claim 1, wherein:
the predetermined operation includes a turn-on operation and a turn-off operation;
the first drive voltage signal is applied to one of the first switching element and the second switching element to perform at least one of the turn-on operation and the turn-off operation of one of the first switching element and the second switching element according to change of the first drive voltage in one of the first and second switching elements;
the delaying unit is configured to delay the application of the second drive voltage signal to the other of the first switching element and the second switching element; and
a drive performing unit configured to perform, based on a change of the delayed second drive voltage signal, a corresponding at least one of the turn-on operation and the turn-off operation of the other of the first switching element and the second switching element while the first drive voltage in one of the first and second switching elements is substantially within a predetermined Miller voltage range.

8. The controller according to claim 1, wherein the delaying unit is configured to:
variably set, according to a difference in temperature between the first switching element and the second switching element, a delay time between a first timing of the application of the first drive voltage signal and a second timing of the application of the second drive voltage;
determine whether the difference in temperature between the first switching element and the second switching element is equal to or higher than a predetermined temperature threshold, one of the first and second switching elements lower in temperature than the other thereof being referred to as a lower-temperature switching element, the other of the first and second switching elements being referred to as a higher-temperature switching element; and apply, when the delaying unit determines that the difference in temperature between the first switching element and the second switching element is equal to or higher than the predetermined temperature threshold, the first drive voltage to one of the first switching element and the second switching element so as to increase a temperature of the lower-temperature switching element.

* * * * *